Figure 3:
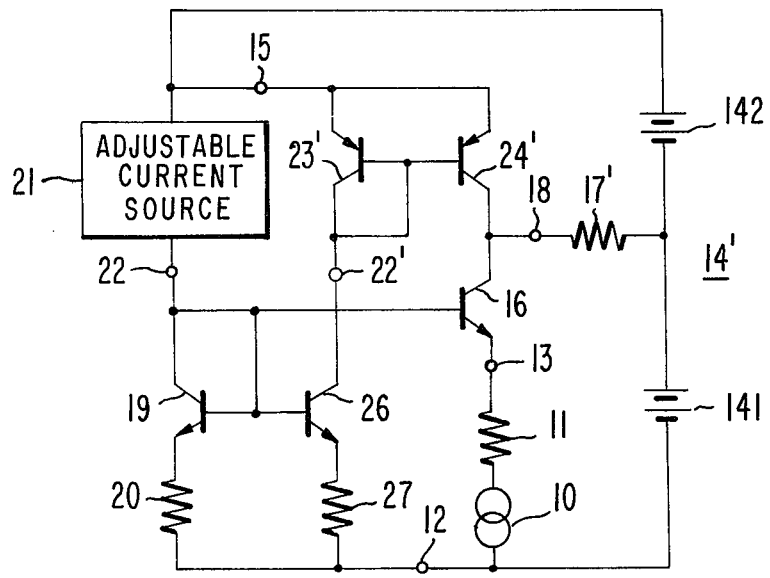

United States Patent [19]

Hall

[11] 3,950,708
[45] Apr. 13, 1976

[54] GAIN-CONTROLLED AMPLIFIER

[75] Inventor: James Robert Hall, Canoga Park, Calif.

[73] Assignee: RCA Corporation, New York, N.Y.

[22] Filed: Nov. 4, 1974

[21] Appl. No.: 520,791

[52] U.S. Cl................... 330/29; 330/38 M; 330/40
[51] Int. Cl.² ......................................... H03G 3/30
[58] Field of Search.......... 330/19, 29, 38 M, 22, 40

[56] References Cited
UNITED STATES PATENTS 3,828,266   8/1974   Okada et al. ......................... 330/29

Primary Examiner—James B. Mullins
Attorney, Agent, or Firm—H. Christoffersen; S. Cohen; A. L. Limberg

[57] ABSTRACT

The collector potential of a resistively loaded common base amplifier tends to change if its emitter current is altered to affect its emitter resistance and thereby control its gain. This tendency arises because of the change in transistor collector current, which is substantially the same value as the change in its emitter current, acting on the resistive load in accordance with Ohm's Law. A control current is applied to diode means to develop a potential thereacross, which is applied to the base emitter junction of the transistor to control its emitter current. This establishes a known proportion of control current to transistor emitter and collector currents. Changes in the transistor collector current are then compensated for by another current proportional to the control current applied at the transistor collector electrode, thereby to counteract the tendency for the transistor collector potential to change as the gain of the common-base transistor amplifier is changed.

15 Claims, 4 Drawing Figures

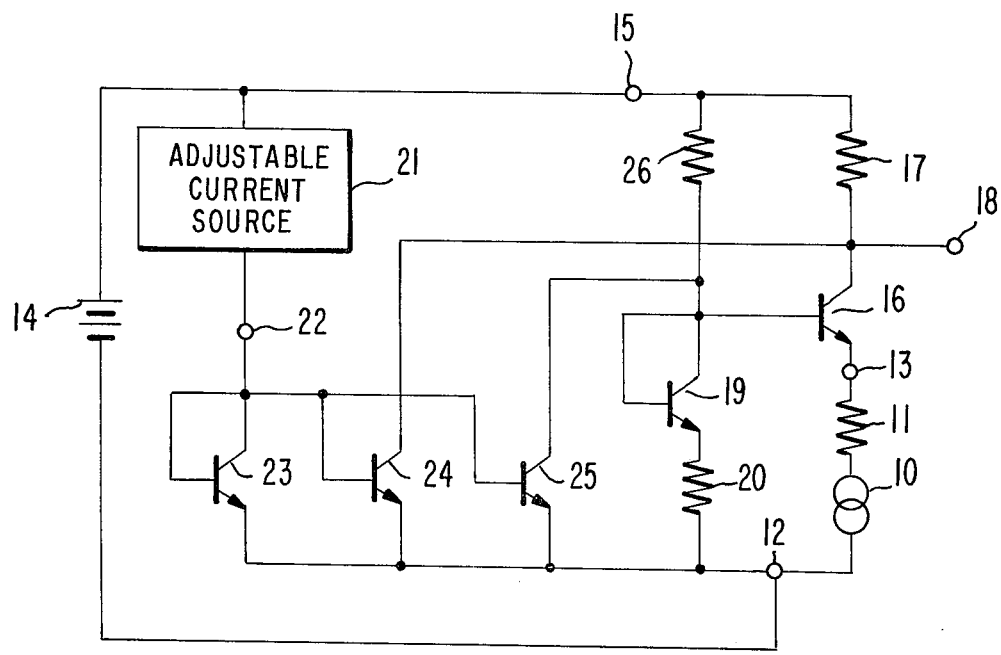
_Fig_1_
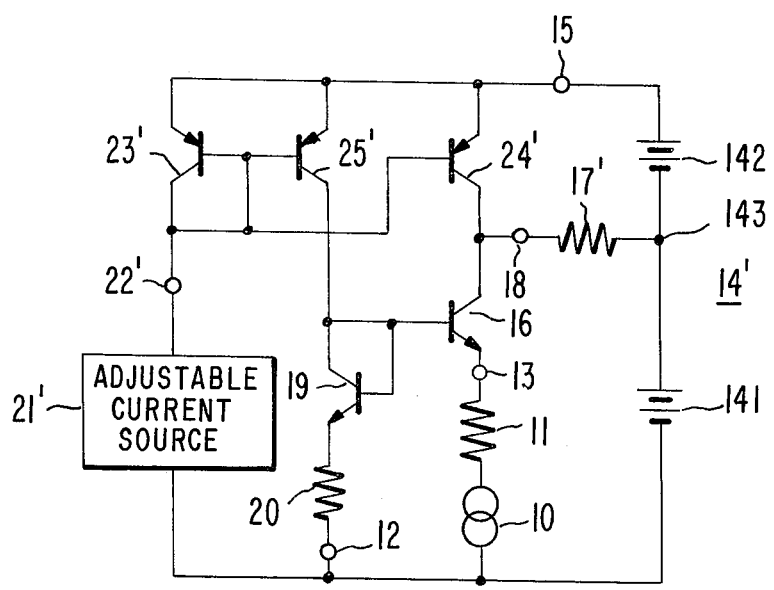
_Fig_2_

GAIN-CONTROLLED AMPLIFIER

The present invention relates to amplifiers with electrically controlled gain.

It is desirable, particularly in monolithic integrated circuits, to have an amplifier which, though its gain is electrically controlled, exhibits no changes in the quiescent level of its output signal when it is controlled. This facilitates the direct coupling of the output circuit of the amplifier to succeeding circuitry. Such amplifers are described, for instance, in U.S. Pat. Nos. 3,141,137; 3,678,403; 3,678,406; 3,737,796; and 3,803,505.

The present invention is embodied in a common base transistor amplifier having its gain controlled by change of the emitter resistance of the transistor as a function of its quiescent emitter current level. A first control current applied to a diode means develops a potential which is applied between the base and emitter electrodes of the transistor. This causes its quiescent collector and emitter currents to be in well-defined proportion to the first control current, so that a second control current linearly related to the first can be applied to a load together with the quiescent collector current of the common-base amplifier transistor. This second control current counteracts changes in the quiescent collector current insofar as their being undesirably coupled to the amplifier load.

IN THE DRAWING

Figure 4:
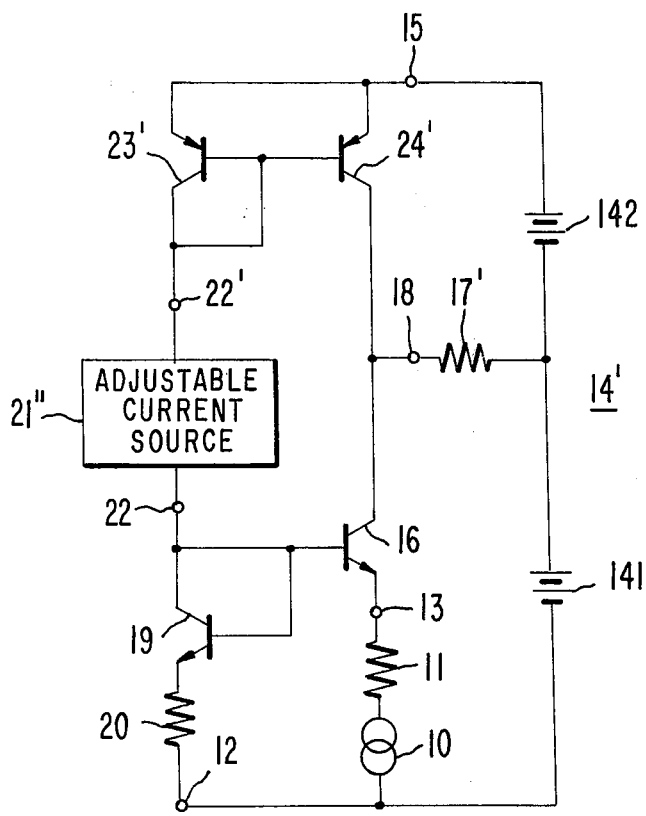

FIG. 1 is a schematic diagram of a common base amplifier with electrically controlled gain, embodying the present invention and not requiring complementary conductivity transistors; and FIGS. 2, 3 and 4 are schematic diagrams of other embodiments of the invention, these using complementary conductivity transistors.

In each of the FIGURES, a source 10 of input signal potential having an internal resistance 11 associated therewith is connected between terminals 12 and 13. Terminal 12 is at a reference potential supplied by battery 14 (or 14'), which also supplies an operating potential to terminal 15. Transistor 16 is connected in common-base amplifier configuration to develop, across resistor 17, an output signal potential which appears at an output terminal 18 for direct coupling to a subsequent circuit (not shown). The base electrode of transistor 16 has applied to it a potential developed across the serial connection of a self-biased transistor 19 and a resistance 20. The self-biased transistor 19 has its base electrode connected to its collector electrode and functions as a diode means. An adjustable current source 21 (21' or 21") supplies a selected value of current as control signal to control terminal 22 (or 22' or 22 and 22') from which it is direct coupled to control the forward biasing of the diode means 19.

In FIG. 1, when the control signal current from source 21 is zero-valued, no potential offset responsive to current is developed across self-biased transistor 23. Transistors 24 and 25 have this zero-valued offset potential applied to their base electrodes and are therefore biased for non-conduction. For this condition, the forward bias current for diode means 19 is developed solely in response to the operating potential at terminal 15, this potential causing current flow through the series connection of resistor 26, self-biased transistor 19, and resistor 20, in accordance with Ohm's Law.

Elements 19, 20, 16 and 11 are proportioned to form the well-known current mirror amplifier configuration insofar as direct currents are concerned. The resistance of resistor 20 is chosen in the same proportion, $G_I$, to the source resistance 11 of source 10 as the transconductance of transistor 16 is to that of transistor 19 at equal base-emitter potentials. The ratio of the transconductance of transistor 16 to that of transistor 19 at equal base-emitter potentials, $G_I$, is the same as the ratio of the effective area of the base-emitter junction of transistor 16 to that of the base-emitter junction of transistor 19, assuming them to be of the same semiconductive material and to have the same diffusion profiles. This is usually the case in monolithic integrated circuit construction, for instance. The quiescent collector current of transistor 16 is $G_I$ times as large as that of transistor 19, and the potential drop across load resistor 17 is easily calculated using Ohm's Law.

It is for this condition, wherein the current from source 21 is zero-valued and transistor 25 is not biased into conduction, that the gain of the common-base amplifier configuration including transistor 16 is greatest. As is well-known, a common-base amplifier having its base electrode connected to a relatively low impedance point has a voltage gain $G_V$ related to its emitter resistance $R_e$ and the resistances $R_{11}$ and $R_{17}$ of its source resistance 11 and its load resistor 17, respectively, as follows:

$$G_V = \frac{R_{17}}{R_e + R_{11}} \qquad (1)$$

Since the emitter resistance, $R_e$, of a transistor equals the reciprocal of its transconductance $g_m$ and since its $g_m$ is proportional to its emitter current $I_E$, equation 1 may be rewritten as follows, where $V'$ is a constant, expressed in units of potential and equal to about 25 millivolts or so.

$$G_V = \frac{R_{17}}{\dfrac{V'}{I_E} + R_{11}} \qquad (2)$$

With transistor 25 non-conductive, it demands no portion of the current flow through resistor 26. That is, therefore, the condition of maximum current flow through the serial connection of self-biased transistor 19 and resistor 20 and the largest possible potential drop according to Ohm's Law develops across this serial combination. This forward biases the base-emitter junction of transistor 16 to the maximum extent; maximum emitter current flow from this transistor and minimum internal emitter resistance is present. As can be seen from equation 1 or 2, this is the condition corresponding to the highest value $G_{V\ MAX}$ of signal voltage gain, $G_V$.

$G_{V\ MAX}$ cannot exceed $R_{17}/R_{11}$ in any case, although in some embodiments of the invention $G_{V\ MAX}$ may be set by limits on $I_E$ and $R_e$, rather than choice of $R_{11}$. This will be done when $R_{11}$ is substantially zero-valued as, for example, when input signal is applied between terminals 12 and 13 from the secondary winding of a transformer.

Transistors 24 and 25 have their respective transconductances in $G_I$:1 ratio as well as do transistors 16 and 19. For the condition where the current applied from source 21 to terminal 22 has been increased to a positive value, transistors 24 and 25 will have their respective base-emitter junctions forward biased to develop like base-emitter potentials, and their respective collector currents will be in $G_I:1$ ratio. The collector current demand of transistor 25 will be supplied from the current flowing in resistor 26, thereby diverting a portion of the current flow through resistor 26 away from the serial connection of self-biased transistor 19 and resistor 20. The resistor 26 with substantially fixed potential thereacross and transistor 25 cooperate to function as a first controlled current source, the control signal for this source being supplied by source 21.

In consequence of the conduction through transistor 25, the potential drop developed across the serial connection will become smaller and the collector and emitter currents flows of transistor 16 will be reduced. Because of the current mirror amplifier action of elements 19, 20, 16, 11, brought about by the proportioning of the emitter-degenerated transconductance characteristics of transistors 16 and 19, the reduction of the emitter and collector current flows of transistor 16 is in the same proportion as the reduction in current flow through the self-biased transistor 19. So, the flow of a collector current $I_{C25}$ of specified value in transistor 25, causing a like-valued reduction in the current flow through self-biased transistor 19, will by the current amplifier action of elements 19, 20, 16, 11, cause a reduction of the collector current demand of transistor 16 of a value $G_I I_{C25}$. Were transistor 24 to contribute no current flow through resistor 17, then, in accordance with Ohm's Law, this decrease of $G_I I_{C25}$ in the collector current demand of transistor 16 would lead to the potential at output terminal 18 increasing by $G_I I_{C25} R_{17}$.

This is precluded from happening, however, because transistor 24 has a transconductance $G_I$ times as large as transistor 25 and therefore demands a collector current $G_I$ times as large as the $I_{C25}$ collector current demanded by transistor 25. This demand by transistor 24 for a collector current of $G_I I_{C25}$ is exactly equal to the reduction in quiescent collector current demand by transistor 16, so the quiescent potential across resistor 17 is not altered. This, of course, facilitates the direct coupling of terminal 18 to subsequent circuitry. Transistor 24 functions as a second controlled current source, the control signal for this source being also supplied by adjustable current source 21.

This condition, where positive current flow from source 21 to terminal 22 causes transistor 25 to demand collector current to divert current flow away from the series connection of self-biased transistor 19 and resistor 20, causes a reduction of gain in the common-base amplifier configuration including elements 11, 16, 17. This is because the reduction of the emitter current $I_E$ of transistor 16 for this condition raises its internal emitter resistance $R_e$. The precise effects of these changes upon the voltage gain $G_V$ of the common-base amplifier configuration can be adjudged from equations 1 and 2 above.

Self-biased transistor 23 in the FIG. 1 circuit is in current mirror amplifier configuration with transistors 24 and 25 and serves to define very exactly the relationship between control current from source 21 and the degree of attenuation obtained in the common-base amplifier configuration comprising elements 11, 16, 17. This is of importance chiefly in open-loop control systems, where uniformity of response between many units and independence from the common-emitter forward current gains of transistors 24 and 25 are sought.

In a closed-loop control system employing degenerative feedback, such as an automatic gain control system, self-biased transistor 23 will often be found unnecessary (or even undesirable inasmuch as it reduces feedback loop gain and thus accuracy of control) and consequently may be omitted in such cases.

Certain other modifications which can be made in the FIG. 1 circuit will occur to one skilled in electronic circuit design. For example, resistors 26 and 17 may be replaced by constant current sources providing currents in $1:G_I$ ratio. Transistors 24 and 25 and, if used, 23 may be provided with emitter degeneration resistors to improve the accuracy of the proportions between their respective transconductances. The collector electrode of transistor 25 may be connected to a tap point on resistor 26, rather than to its end. With a source 10 having substantially no internal resistance 11, resistor 20 may be omitted. The circuit will work with other types of transistors than bipolar junction transistors (e.g., junction field-effect transistors or metal-oxide-semiconductor field-effect transistors). A whole class of modifications exist wherein the simple current mirror amplifier configurations of elements 19, 20, 16, 11 or 23, 24, 25 are replaced by nearly any one of the well-known more complex current mirror amplifier configurations.

The FIG. 1 circuit is advantageous in that it requires only one conductivity type of transistor. It does have the problem, however, that as the gain $V_G$ of the common-base amplifier configuration 11, 16, 17 is reduced, the gain of transistor 24 is increased. This may result in the level of noise internally generated in the transistors 16 and 24 remaining relatively constant despite signal at terminal 18 being much attenuated with a resultant undesirable reudction of signal-to-noise ratio at terminal 18. Providing transistors 23, 24 and 25 with emitter degeneration can help alleviate this condition. And, of course, by-passing terminal 22 to terminal 12 with a large capacitor will help to prevent noise from source 21 reducing the signal-to-noise ratio at terminal 18. This shortcoming with regard to reduced signal-to-noise ratio at low signal currents is also found in many prior art attenuators having compensation for changes in the quiescent output signal level. If one can permit the use of transistors of complementary conductivity types as shown in FIGS. 2–4, then it is possible to overcome this problem.

In the FIG. 2 configuration, resistors 17 and 26 are discarded and are replaced by the current sources provided at the collector electrodes of transistors 24' and 25', respectively, which are of complementary conductivity type to that of transistors 16 and 19. The currents provided at the collector electrodes of transistors 24' and 25' are in $G_I:1$ ratio respectively. Battery 14' comprises two serially-connected batteries 141 and 142. This makes an intermediate potential available at terminal 143. Collector load resistor 17' connects terminal 143 to terminal 18, to which the collector electrodes of transistors 16 and 24' are also each connected. The circuit is so configured that the quiescent collector current demand of NPN transistor 16 is always supplied in substantially exact measure by the collector current of PNP transistor 24'. Therefore, substantially no quiescent current flows in resistor 17', and the quiescent potential at terminal 18 is substantially equal to the intermediate potential at terminal 143. The circuit is such that the relative potentials of batteries 141 and 142 can be selected to place the intermediate potential anywhere in the range of a few tenths of a volt more positive than the reference potential at terminal 12 to a few tenths less positive than the operating potential at terminal 15.

More particularly, when source 21' supplies no current to terminal 22', neither of transistors 24' or 25' is biased into conduction. No current is applied to the series connection of self-biased transistor 19 and resistor 20, so no potential is developed across them. In the absence of forward bias potential between its base and emitter electrodes, transistor 16 has very high emitter resistance $R_e$, is non-conductive, and therefore fully attenuates input signal from source 10. With both transistors 16 and 24' non-conductive, there is no noise supplied from or through them to terminal 18.

When current source 21' does supply a relatively small current to bias transistors 24' and 25' to a relatively low level of conduction, the collector current of transistor 25' develops a potential drop across elements 19, 20 that also biases transistor 16 into a relatively low level of conduction. Even at these low collector current levels, the quiescent collector current levels of transistors 16 and 24' match. The transconductances of transistors 16 and 24' are low, so they do not greatly amplify noise accompanying their base-emitter potentials, avoiding degradation of the signal-to-noise ratio at terminal 18 due to this cause. Further, at low current levels the internally generated noise of transistors 16 and 24' themselves is low which also helps maintain good signal-to-noise ratio at terminal 18 for the large signal attenuation condition.

When current source 21' supplies a relatively large current to bias transistors 24', 25' and 16 to relatively high levels of conduction, the gain $G_V$ of the common-base amplifier 11, 16, 17' will be increased in similar proportion to the increase of current from source 21'. Self-biased transistor 23' may be included to define the ratio of control current from source 21' to the quiescent collector currents of transistors 16 and 24', if one so desires. But, because of the push-pull nature of the collector currents of transistors 16 and 24', there is less need for self-biased transistor 23' than there is for self-biased transistor 23 in the FIG. 1 circuit.

The FIG. 2 configuration is adapted for use with an adjustable current soruce 21' that withdraws a positive current from terminal 22'. It is, for example, well-suited for use with a circuit in which control current is supplied from the collector electrode of an NPN transistor. It may, however, be necessary or desirable to operate with an adjustable current source 21 supplying a positive control current to a control terminal 22, as from the collector electrode of a PNP transistor, for example.

FIG. 3 shows a circuit accomodating such need or desire. The adjustable current source 21 supplies a current $I_{22}$ flowing through terminal 22 for direct application to the series connection of self-biased transistor 19 and resistor 20. An increase of this current $I_{22}$ will—by current mirror amplifier action of elements 11, 16, 19, 20—cause an increase of the emitter current $I_e$ of transistor 16 larger than the increase of $I_{22}$ by a factor of $G_I$. There will be a concomitant proportional increase in the gain $G_V$ of the common-base amplifier configuration 11, 16, 17. A decrease of this current $I_{22}$ will—again by current mirror amplifier action of elements 11, 16, 19, 20—cause a decrease of the emitter current $I_e$ of transistor 16 larger than the decrease of $I_{22}$ by a factor of $G_I$. There will be a concomitant proportional increase in the gain $G_V$ of the common-base amplifier configuration 11, 16, 17. When no current is supplied from source 21 a condition of full attenuation will obtain.

Self-biased transistor 19 and resistor 20 are in current mirror amplifier configuration with transistor 26 and its emitter degeneration resistor 27, so the collector current of transistor 26 varies in linear proportion to the current supplied to terminal 22 by source 21. The collector current of transistor 26 is withdrawn from terminal 22'. The product of the current gains of the current mirror amplifier configuration comprising elements 19, 20, 26, 27 and that comprising elements 23', 24' should equal $G_I$, the current gain of the current mirror amplifier configuration comprising elements 19, 20, 16, 11. Then, the quiescent potential at terminal 18 will remain unchanged despite change in the level of control current $I_{22}$ supplied from source 21.

FIG. 4 shows a variation of the FIG. 3 circuit in which an adjustable current source 21'' is connected between terminals 22 and 22', permitting the elimination of elements 26, 27. Transistors 23' and 24' have their transconductance characteristics proportioned in the same ratio as those of transistors 19 and 16, respectively. The gain $G_V$ of the common-base amplifier configuration 11, 16, 17 will vary in proportion to the level of current provided by the adjustable current source 21''. The current source 21'' may comprise, for example, a transistor having its emitter electrode connected by direct current conductive means to one of the terminals 22 and 22', having its collector electrode connected to the other of the terminals 22 and 22', and having a control signal applied to its base electrode.

Modifications discussed in connection with the FIG. 1 circuit may be made to the circuits of FIGS. 2, 3 and 4, where applicable. Also, in each of the circuits all the transistors of each conductivity type may be replaced by transistors of the complementary conductivity type. The present invention may be implemented using field-effect transistors and the terms "base", "emitter" and "collector" in the claims are to be construed as being descriptive of the "gate", "source" and "drain" electrodes, respectively, of a field-effect transistor in addition to their conventional meaning.

What is claimed is:

1. An amplifier in which the ratio of the amplifier output signal to the amplifier input signal is responsive to a control signal, said amplifier comprising:
   a first terminal for application of a direct reference potential;
   a second terminal for application of an input signal potential having a quiescent value substantially equal to said reference potential;
   a third terminal for supplying said output signal;
   a load direct coupled to said third terminal;
   a first transistor of a first conductivity type, having base, emitter and collector electrodes, said collector electrode being connected to said third terminal and said emitter electrode being connected to said second terminal;
   a first controlled current source responsive to a control signal for supplying a first controlled current;
   first diode means connected between said first terminal and said first controlled current source and poled for easy conduction of said first controlled current, said first diode means responding to the flow of said first controlled current therethrough to develop a substantially direct offset potential between said first terminal and said first transistor base electrode, which offset potential controls the flow of collector current in said first transistor; and a second controlled current source responsive to said control signal for supplying a second controlled current to said third terminal to counteract changes in the quiescent component of said first transistor collector current as supplied to said load.

2. An amplifier as set forth in claim 1 having:

second and third transistors, each having a base and an emitter and a collector electrode, their respective collector electrodes being connected respectively to said first transistor base electrode and to said first transistor collector electrode;

means for similarly and adjustably biasing the base electrodes of said third and said fourth transistors with respect to their emitter electrodes using said control signal, to implement said first and said second controlled current sources, respectively.

3. An amplifier as set forth in claim 2 wherein said second and said third transistors are of said first conductivity type, the respective emitter electrodes of each of said second and said third transistors are similarly connected to said first terminal, the respective base electrodes of said second and said third transistors are connected to receive said control signal, a first resistor and a second resistor have their first ends connected respectively to said first transistor base electrode and to said second transistor collector electrode and have respective second ends, and a fourth terminal for application of an operating potential has the second ends of said first and said second resistors connected thereto.

4. An amplifier as set forth in claim 3 having:

means for connecting each of said second and said third transistors in current mirror amplifier configuration.

5. An amplifier as set forth in claim 2 wherein said second and said third transistors are of a second conductivity type complementary to said first conductivity type, a fifth terminal has the respective base electrodes of said second and third transistors connected thereto to receive said control signal; and a fourth terminal for application of an operating potential has the emitter electrodes of said second and third transistors similarly connected to it.

6. An amplifier as set forth in claim 5 having:

means for connecting each of said second and said third transistors in current mirror amplifier configuration.

7. An amplifier as set forth in claim 1 having:

a fourth terminal for application of an operating potential;

a second transistor of said first conductivity type, said third transistor having a base electrode connected to the same end of said first diode means as is said first transistor base electrode, said third transistor having an emitter electrode connected to said first terminal and having a collector electrode; and current mirror amplifier means having an input terminal to which the collector electrode of said third transistor is connected, having a common terminal connected to said fourth terminal, and having an output terminal connected to said third terminal.

8. An amplifier as set forth in claim 1 wherein said second controlled current source includes:

a fourth terminal for application of an operating potential; and current mirror amplifier means being included in said second controlled current source having an input terminal between which and said first transistor base electrode said first controlled current source is connected and having an output terminal connected to said third terminal.

9. An amplifier as set forth in claim 1 wherein said diode means is provided by:

a further transistor having an emitter electrode connected to said first terminal, having a collector electrode connected to said first controlled current source, and having a base electrode, the base electrodes of said first and said further transistors each having said further transistor collector electrode direct coupled thereto.

10. A circuit for controlling the gain of a common-base transistor amplifier comprising a transistor having emitter and collector and base electrodes, a base-emitter junction between said base and emitter electrodes, said emitter electrode being direct current conductively coupled through an input signal source to a terminal at a reference potential, and said collector electrode being coupled through a load to an operating voltage terminal, said circuit comprising:

diode means coupled between said base electrode and said terminal at said reference potential in the forward direction relative to said base-emitter junction of said transistor;

means for supplying a quiescent current in the forward direction to said diode means to establish a quiescent forward voltage thereacross;

means for applying a constant proportion of said quiescent forward voltage across the base-emitter junction of said transistor whereby at a quiescent current level to establish a given quiescent forward voltage across said diode means for application across the base-emitter junction of said transistor, a given value of quiescent collector current flows through said transistor and a corresponding given value of quiescent voltage exists at the collector electrode of said transistor;

means responsive to a control signal for changing the amount of current flow through said diode means and correspondingly changing the forward bias voltage across said base-emitter junction, whereby the flow of said collector current changes; and means coupled to said collector electrode and also responsive to said control signal for maintaining the quiescent voltage at said collector electrode at said given value notwithstanding said change in the flow of said collector current.

11. A circuit as set forth in claim 10, wherein the last-named means comprises a current path connected between said collector electrode and one of said terminals and means responsive to said control signal for controlling the impedance of said path to control the current flow through said path to maintain the quiescent voltage at said collector electrode at said given value.

12. A circuit as set forth in claim 11, wherein said current path comprises the emitter-to-collector path of a second transistor.

13. A circuit as set forth in claim 12, wherein said second transistor is of the same conductivity type as said first transistor and is connected at its emitter electrode to said terminal at said reference potential and at its collector electrode to the collector electrode of the first mentioned transistor.

14. A circuit as set forth in claim 12, wherein said second transistor is of a conductivity type complementary to that of the first mentioned transistor and is connected at its emitter electrode to said operating voltage terminal and at its collector electrode to the collector electrode of the first mentioned transistor.

15. A circuit as set forth in claim 10, further including a signal source and wherein the coupling of said emitter electrode to said terminal at said reference potential is via said signal source.

* * * * *